United States Patent [19]

Hulsing, II et al.

[11] Patent Number: 4,786,861

[45] Date of Patent: Nov. 22, 1988

[54] FREQUENCY COUNTING APPARATUS AND METHOD

[75] Inventors: Rand H. Hulsing, II, Redmond; Charles K. Lee, Seattle, both of Wash.

[73] Assignee: Sundstrand Data Control, Inc., Redmond, Wash.

[21] Appl. No.: 91,977

[22] Filed: Sep. 1, 1987

[51] Int. Cl.$^4$ .............................................. G01R 23/02
[52] U.S. Cl. .............................. 324/78 R; 324/78 D; 324/83 D; 377/19
[58] Field of Search .................... 377/19, 39; 328/133, 328/151, 134, 136; 307/352, 516; 324/77 R, 78 R, 78 D, 79 R, 79 D, 83 R, 83 D

[56] References Cited

U.S. PATENT DOCUMENTS

| | | | |
|---|---|---|---|
| 3,928,798 | 12/1975 | Valis | 324/78 D |
| 4,051,434 | 9/1977 | Sweet | 324/78 D |
| 4,070,618 | 1/1978 | Thomas | 324/83 D |
| 4,073,432 | 2/1978 | Schroder | 324/78 D |
| 4,541,105 | 9/1985 | Lee et al. | 377/19 |
| 4,665,748 | 5/1987 | Peters | 73/505 |

OTHER PUBLICATIONS

U.S. patent application Ser. No. 908,356, Vibrating Beam Accelerator with Velocity Change Output, filed 9/17/86, inventor R. B. Peters.
U.S. patent application Ser. No. 789,657, Synchronous FM Digital Detector, filed 10/21/85, inventor R. B. Peters.

Primary Examiner—Michael J. Tokar
Attorney, Agent, or Firm—Christensen, O'Connor, Johnson & Kindness

[57] ABSTRACT

A device and method for measuring the frequency of an input signal by measuring the number of cycles of the input signal that occur in a sample interval between successive sampling times $t_n$. An integer counter determines an estimated integer number of input signal cycles, and fraction counters determine fractional counts by counting cycles of a clock signal during time intervals between a first measurement time before the sampling time and a second measurement time after the sampling time. A correction circuit refines the fractional counts by determining the phase relationships between the clock and input signals at each measurement time. The correction circuit includes a constant current source, a capacitor, a first switch connected between the constant current source and a reference potential, a second switch connected between the constant current source and the capacitor, and a control circuit for the switches. The control circuit disconnects the current source from the reference potential at each measurement time, and disconnects the current source from the capacitor upon the next occurance of a periodic characteristic of the clock signal that occurs after the measurement time. The voltage on the capacitor then provides the required phase relationship.

30 Claims, 4 Drawing Sheets

FREQUENCY COUNTING APPARATUS AND METHOD

FIELD OF THE INVENTION

The present invention relates to a high resolution frequency counting technique. The technique is particularly suitable for use with accelerometers and other sensors that produce a frequency modulated output signal.

BACKGROUND OF THE INVENTION

A common type of instrument is one in which a sensor produces a signal whose frequency is related in some functional way, often nonlinear, to a physical input variable. In order to use such a sensor in a digital system, the frequency of the sensor signal must be converted into a series of digital samples. The simplest and most straightforward way to measure frequency is to count cycles of the sensor or input signal for a known time interval. However, for many applications, the resolution produced by such a technique is far too low, unless unacceptably long time bases are used. While more complex techniques have been used to increase resolution, many of such prior techniques do not provide continuous data capture, real time processing, or synchronization of the data to a sampling frequency.

SUMMARY OF THE INVENTION

The present invention provides a device and method for measuring the frequency of an input signal by accurately measuring the number of cycles of the input signal that occur in a sample interval between successive sampling times. In a preferred aspect, the invention provides for real time, continuous data acquisition from an input signal that is asynchronous with respect to the sample interval.

In one aspect, the present invention provides a frequency measuring device comprising means for providing a clock signal having a frequency higher than that of the input signal, integer counter means, fraction measurement means and processing means. The integer counter means includes means for sensing a periodic characteristic of the input signal and for producing therefrom an integer signal representing an estimated integer number N of cycles of the input signal that occur in the sampling interval. The fraction measurement means determines the time of occurrence of each sampling time $t_n$ in a time period that extends from a first measurement time $t_a$ to a second measurement time $t_b$. First measurement time $t_a$ corresponds to the occurrence of the characteristic of the input signal preceding $t_n$, and second measurement time $t_b$ corresponds to the occurrence of the characteristic of the input signal following $t_n$.

The fraction measurement means comprises first and second counter means and a correction circuit. The first counter means determines a first count value by counting the number of cycles of the clock signal that occur between times $t_n$ and $t_b$, and produces a corresponding first count signal $X_n$. The second counter means determines a second count value by counting the number of cycles of the clock signal that occur between the measurement times, and produces a corresponding second count signal $Y_n$. The correction circuit produces phase signals $a_n$ and $b_n$ that represent the phase of the clock signal at measurement times $t_a$ and $t_b$, respectively. The processing means receives the integer signal and the count and phase signals for each sampling time. The processing means includes means for adjusting count signals $X_n$ and $Y_n$ for each sampling time based upon the phase signals for that sampling time, to thereby produce corrected count signals $X_{nc}$ and $Y_{nc}$ for each sampling time. The processing means also includes means for measuring the number of cycles $C_n$ of the input signal that occurred in the sampling interval by determining N plus the quotient $Y_{nc}/Y_{nc}$ for the first sampling time minus the quotient $X_{nc}/Y_{nc}$ for the second sampling time.

In a preferred embodiment, the correction circuit comprises charge storage means, current source means, first and second switch means, and control means. The first switch means is connected between the current source means and a reference potential, and the second switch means is connected between the current source means and the charge storage means. The control means includes means for sensing a periodic characteristic of the clock signal, means operative at each measurement time for causing the current source means to be disconnected from the reference potential at the measurement time, for causing the current source means to be disconnected from the charge storage means upon the occurrence of said characteristic of the clock signal after the measurement time, and for measuring the voltage on the charge storage means after the occurrence of said characteristic and producing therefrom the phase signal corresponding to that measurement time. Calibration means may also be provided for calibrating the correction circuit at each sampling time, to reduce errors due to component drifts and other sources.

In a second aspect, the present invention provides a device and method for determining the time of occurrence of a sampling time $t_n$ in a time period that extends from a first measurement time $t_a$ to a second measurement time $t_b$. In a third aspect, the present invention provides a device and method for determining the phase of a periodic reference or clock signal at a predetermined time, the predetermined time corresponding to the sampling time of the frequency measuring device.

DETAILED DESCRIPTION OF THE INVENTION

Figure 1:
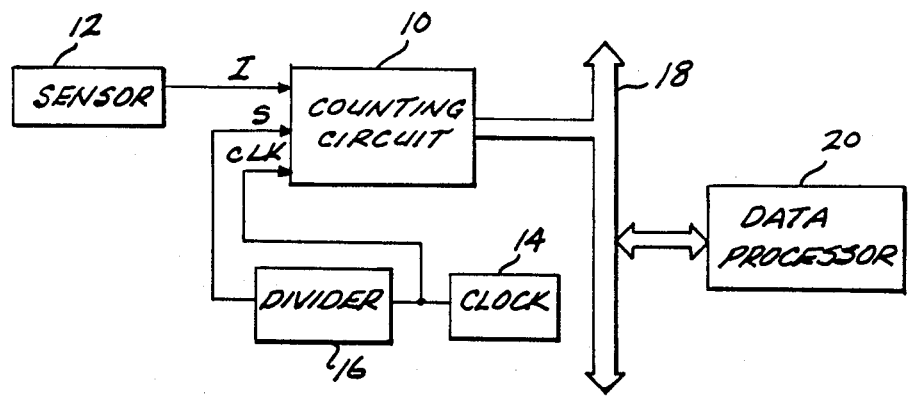
FIG. 1 is a block diagram of a sensor system that includes the counting circuit of the present invention.

Referring initially to FIG. 1, an instrument or device is shown that includes counting circuit 10 of the present invention. The instrument includes sensor 12, clock 14, divider 16 and data processor 20. Sensor 12 produces an input signal I whose frequency is a function of the variable sensed or measured by the sensor. It is desired to sample the value of this variable by converting the frequency of the input signal into a series of digital byte samples for use by a data processor 20. The conversion is carried out by counting circuit 10. The inputs to counting circuit 10 include the input signal I, a sample signal S that defines the sampling intervals, and a reference clock signal CLK. The clock signal is a periodic signal, preferably a square wave, having a frequency substantially higher than that of input signal I. The clock signal is input to divider 16, and the divider divides the clock signal frequency by an integer to produce the sample signal S. The frequency of sample signal S is less than the frequency of input signal I.

The sample signal defines a series of successive sampling intervals. During time periods associated with each sampling interval, counting circuit 10 counts the cycles of input signal I and of clock signal CLK, as described in more detail below. At the end of the sampling interval, the accumulated counts are stored, and counting is immediately resumed for the next sampling interval. During the next sampling interval, counting circuit 10 outputs digital signals corresponding to the stored counts onto bus 18. The digital signals are utilized by data processor 20 to determine the value of the variable sensed by sensor 12. In the preferred arrangement shown in FIG. 1, the sample signal is derived from the clock signal, and the sample and clock signals are therefore in-phase. This feature simplifies the counting operations, as described below. Because the frequency of input signal I varies as the variable sensed by sensor 12 varies, the clock and sample signals are asynchronous with respect to the input signal.

Figure 2:
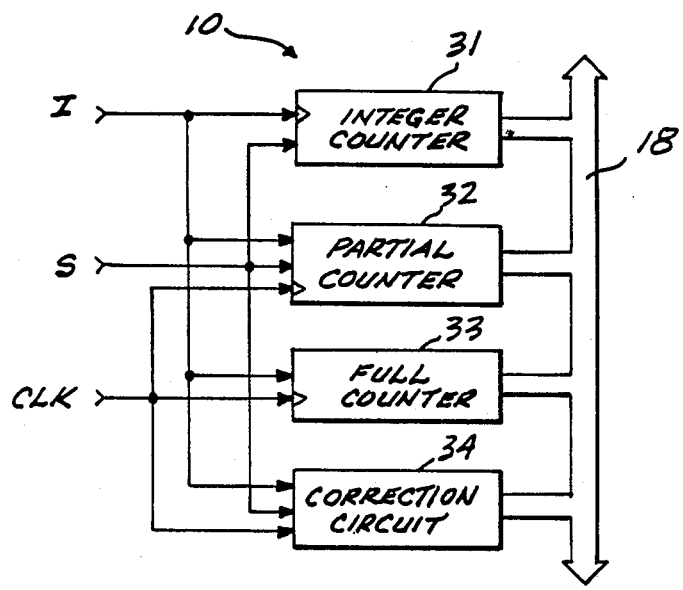
FIG. 2 is a block diagram of the counting circuit.
Figure 3:
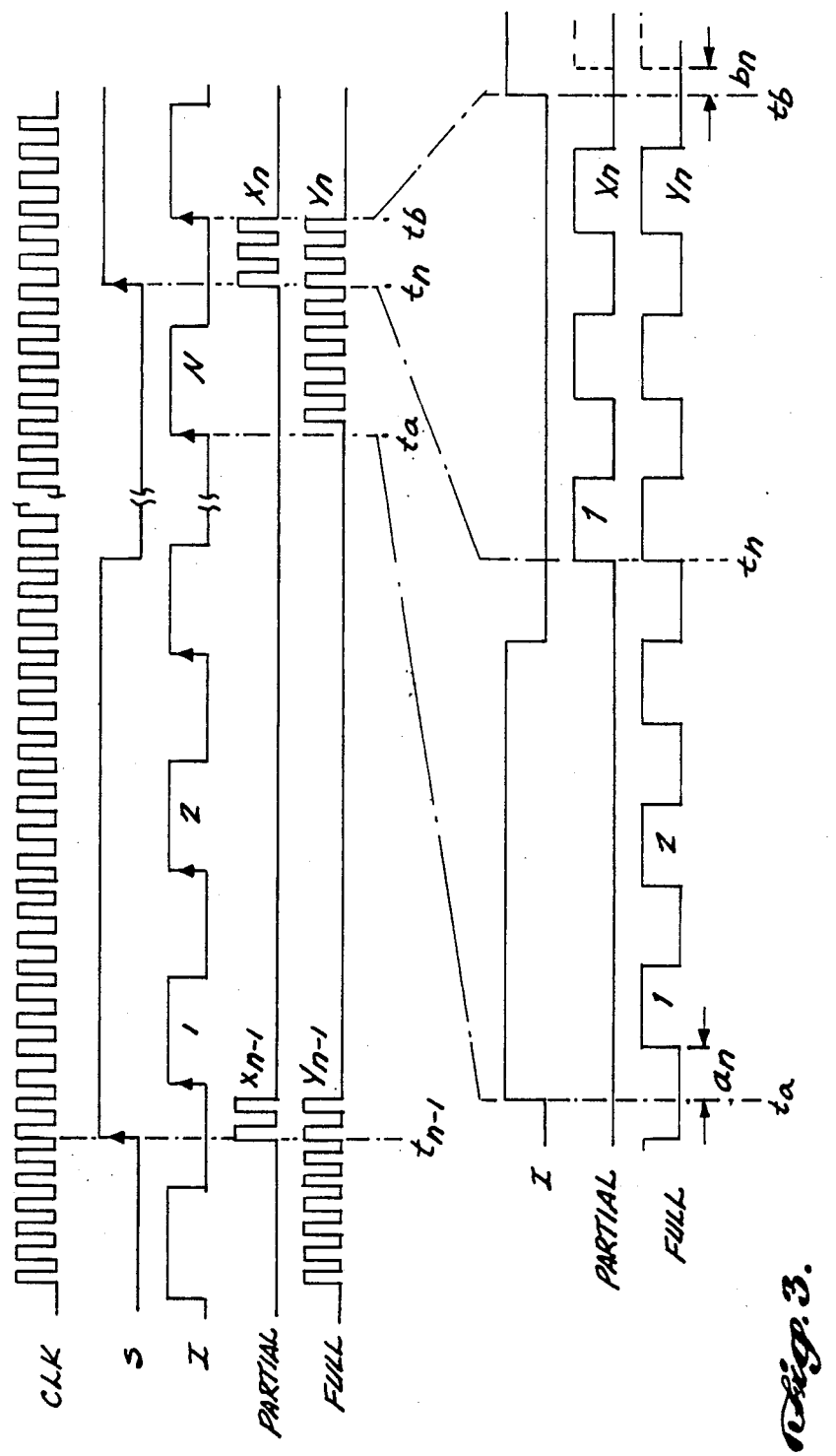
FIG. 3 is a graph showing waveforms associated with the circuit of FIG. 2.

A preferred embodiment of counting circuit 10 is shown in block diagram form in FIG. 2, and related waveforms are illustrated in FIG. 3. As shown in FIG. 2, counting circuit 10 comprises integer counter 31, partial counter 32, full counter 33 and correction circuit 34. The counting circuit receives input signal I, sample signal S and clock signal CLK. Waveforms for the clock, sample and input signals are illustrated on the first three rows respectively of FIG. 3, with the frequency differences between the signals reduced (as compared to a typical embodiment) for ease of illustration. As previously described, in a preferred embodiment, the clock signal bears a predetermined phase relationship to the low frequency sample signal, i.e., each rising edge of the sample signal is coincident with one of the rising edges of the clock signal. Input signal I is an intermediate frequency signal that is asynchronous with the clock and sample signals. In the preferred embodiment to be described herein, the rising edges of the sample signal define successive sampling times $t_{n-1}$ and $t_n$, and the purpose of counting circuit 10 is to precisely determine the number of cycles of input signal I that occur in the sampling interval between such successive sampling times.

Integer counter 31 is a buffered counter that receives the input signal at its clock input, and the sample signal at its reset input. At each rising edge of the sample signal, integer counter 31 transfers its accumulated count to an output buffer, and resets its count to zero. Thereafter, integer counter 31 increments its count by one for each rising edge of the input signal. Thus, at the end of each sampling interval, the output buffer of the integer counter is loaded with a count value N that is an approximation of the number of cycles of the input signal in the sampling interval. At any convenient time after the sampling time and prior to the next sampling time, the integer counter 31 transfers the value N from its output buffer to data processor 20 via bus 18.

Partial counter 32 and full counter 33 operate in combination to povide an estimate of the fractional number of cycles of the input signal that occur during each sampling interval. Thus with reference to the lines labeled PARTIAL and FULL in FIG. 3, at each sampling time $t_n$, partial counter 32 counts the cycles of the clock signal that occur between the sample time $t_n$ and a subsequent measurement time $t_b$ at which the next rising edge of the input signal occurs. Full counter 33 counts the number of cycles of the clock signal that occur between the rising edges of the input signal that occur immediately before and immediately after the sample time $t_n$, i.e., from measurement time $t_a$ to measurement time $t_b$. These counts are labeled $X_n$ and $Y_n$ respectively. Thus the fraction $X_n/Y_n$ represents the fraction of the Nth cycle of the input signal that occurred after sampling time $t_n$. Partial counter 32 may be implemented as a buffered counter that counts cycles of the clock signal. The partial counter is reset to zero and enabled by each rising edge of the sample signal, and disabled from further counting by each rising edge of the input signal. Partial counter 32 may also be implemented as an unbuffered countered that is enabled by each rising edge of the sample signal, and disabled from further counting by the rising edge of the input signal that next follows the rising edge of the sample signal. Such an unbuffered counter may subsequently be reset after the accumulated count $X_n$ has been transferred to the data processor. Full counter 33 may be implemented as a buffered counter that counts cycles of the clock signal, and that is reset by each rising edge of the input signal. Full counter 33 may also be implemented as an unbuffered counter that is reset by each rising edge of the input signal that precedes the rising edge of the sample signal, and disabled from further counting by the rising edge of the input signal that immediately follows the rising edge of the sample signal. The unbuffered full counter may subsequently be enabled after the accumulated count $Y_n$ has been transferred to the data processor.

By inspection of FIG. 3, it may be seen that for the sampling interval defined by times $t_{n-1}$ and $t_n$, the integer count N determined by integer counter 31 should be adjusted by adding the fraction $X_{n-1}/Y_{n-1}$ and by subtracting the fraction $X_n/Y_n$, i.e., the count $C_n$ of the number of cycles of the input signal in the sampling interval ending at time $t_n$ is:

$$C_n = N + \frac{X_{n-1}}{Y_{n-1}} - \frac{X_n}{Y_n} \tag{1}$$

This calculation is performed by data processor 20 for each sampling interval. Note that the fraction $X_n/Y_n$ that is subtracted from the calculation at sampling time $t_n$ will be added for the calculation at the subsequent sampling time $t_{n+1}$. Thus each fractional count $X_n/Y_n$ needs to be determined only once, and can be stored and reused for the following sampling interval.

From the above discussion, it will be clear that the use of the clock signal and counters 32 and 33 provide an improvement in the determination of the frequency of the input signal by a factor equal to the frequency of the clock signal divided by the frequency of the input signal. For typical frequencies of 12 MHz for the clock signal and 34 kHz for the input signal, an improvement in resolution of over 350 is obtained. A further improvement in resolution is provided by correction circuit 34. Referring again to FIG. 3, the fixed phase relationship between the sample and clock signals guarantees that the count performed by partial counter 32 will begin precisely at the rising edge of the clock signal. However, measurement times $t_a$ and $t_b$ will in general be asynchronous with respect to the clock signal, because they are determined by the times of occurrence of rising edges of the input signal. Thus there is an uncertainty in the determination of the partial and full counts $X_n$ and $Y_n$ respectively, the amount of uncertainty being determined by the period of the clock signal. This uncertainty is illustrated in the bottom portion of FIG. 3, wherein expanded portions of the input signal and of the PARTIAL and FULL waveforms are provided between times $t_a$ and $t_b$. There is a phase offset or time delay $a_n$ between time $t_a$ and the succeeding rising edge of the clock signal, and a similar phase offset or time delay $b_n$ between time $t_b$ and the next succeeding edge of the clock signal. Because of the fixed phase relationship between the sample and clock signals, there is no offset or delay between time $t_n$ and the next succeeding edge of the clock signal.

Figure 4:
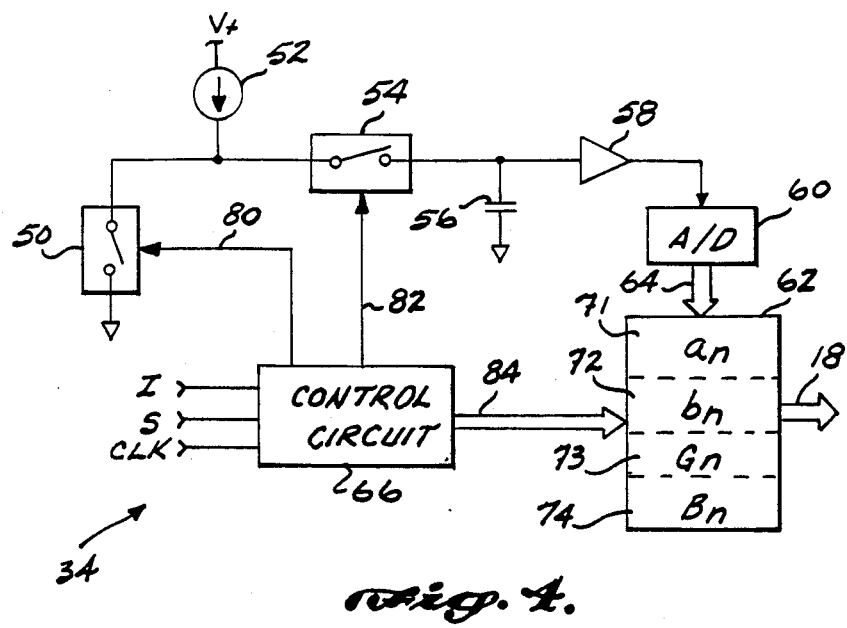
FIG. 4 is a circuit block diagram of the correction circuit.

Correction circuit 34 improves the resolution of the counting circuit by measuring the phase offsets $a_n$ and $b_n$ associated with each sampling time $t_n$. In a preferred technique, the correction circuit determines the phase offsets by measuring the elapsed time between each measurement time $t_a$ and $t_b$ and the next occurrence of a periodic characteristic of the clock signal, e.g., between each measurement time and the next rising edge of the clock signal. A preferred embodiment of correction circuit 34 is shown in FIG. 4. Correction circuit 34 comprises switch 50, constant source 52, switch 54, capacitor 56, buffer amplifier 58, analog-to-digital converter (A/D) 60, memory 62, and control circuit 66. Switch 50 is connected between constant current source 52 and a reference potential (ground), and switch 54 is connected between constant current source 52 and capacitor 56. Amplifier 58 is also connected to capacitor 56, and the output of amplifier 58 is input to A/D 60. The output of A/D 60 is coupled to memory 62 by a bus 64. Control circuit 66 controls switches 50 and 54 via lines 80 and 82, respectively, and controls memory 62 via lines 84.

Operation of the correction circuit can be readily understood by assuming both switches 50 and 54 are initially closed. In this condition, both capacitor 56 and constant current source 52 are shunted to ground, and the capacitor therefore stores no charge. Control circuit 66 opens switch 50 at a rising edge of the input signal I. At such time, constant current source 52 begins charging capacitor 56 at a constant, known rate. The control circuit opens switch 54 at the next rising edge of the clock signal CLK, and capacitor 56 stops charging. Because the capacitor was charged from a constant current source, the voltage on the capacitor after switch 54 is opened is directly proportional to the time between the rising edge of the input signal and the next rising edge of the clock signal. The illustrated correction circuit may therefore be used to provide a direct measure of phase offsets $a_n$ and $b_n$. Switches 50 and 54 may subsequently be closed at any convenient time, such as at the next falling edge of the input signal. In general, the switches should remain open for the minimum time required to read the voltage on capacitor 56, as described below, in order to permit constant current source 52 to stabilize prior to the next rising edge of the input signal.

The voltage on capacitor 56 is input to buffer amplifier 58. This amplifier should have a very low leakage current, so that the voltage accumulated on capacitor 56 maintains its value until it is measured. Amplifier 58 ranges the voltage across the capacitor 56, to provide a full range for A/D 60. A/D 60 may be any high speed analog-to-digital converter with enough bits to suit the application. In a preferred embodiment, it is a flash 8 bit A/D. Thus the output of A/D 60 is a parallel 8-bit byte that is transferred via bus 64 to memory 62. As illustrated in FIG. 4, memory 62 includes memory locations 71 and 72 for the phase offsets $a_n$ and $b_n$, resectively, and memory locations 73 and 74 for a gain value $G_n$ and a bias value $B_n$, respectively, the gain and bias values being described below. Ignoring the gain and bias values for the moment, in one suitable operational sequence, memory 62 stores each value received from A/D 60 via bus 64 in storage location 71, unless a signal is received from control circuit 66 via lines 84 indicating that a rising edge of the sample signal has just occurred, in which case the value is stored in storage location 72 as parameter $b_n$. Thus $a_n$ values are continually updated in storage location 71 until a sample time occurs. After the storage of parameter $b_n$ in storage location 72, the values $a_n$ and $b_n$ are read out via bus 18 to the data processor.

By inspection of FIG. 3, it may be seen that the values $a_n$ and $b_n$ may be used to modify partial count $X_n$ and full count $Y_n$ to produce corrected partial count $X_{nc}$ and corrected full count $Y_{nc}$ as follows:

$$X_{nc} = X_n - b_n \qquad (2)$$

$$Y_{nc} = Y_n + a_n - b_n \qquad (3)$$

The corrected partial and full counts may then be used in equation (1) to determine the count $C_n$ of the number of cycles of the input signal in the sampling interval. The full expression for $C_n$ in terms of the partial and full counts and phase offsets is therefore:

$$C_n = N + \frac{X_{n-1} - b_{n-1}}{Y_{n-1} + a_{n-1} - b_{n-1}} - \frac{X_n - b_n}{Y_n + a_n - b_n} \qquad (4)$$

The improvement of resolution represented by Equation (4) will in general depend upon the number of bits in A/D 60.

Figure 5:
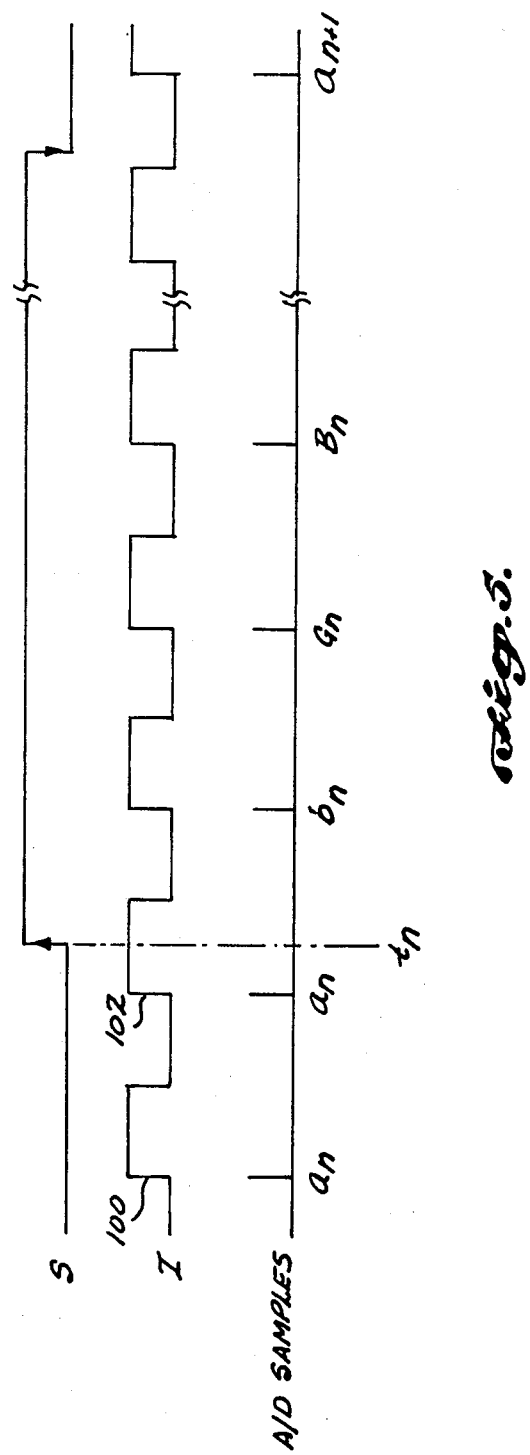
FIG. 5 is a partial waveform graph illustrating the calibration technique.

In a preferred embodiment, correction circuit 34 includes means for calibrating the phase offsets at each sampling time $t_n$. The calibration operation can be understood with reference to the signal diagram of FIG. 5. Assume that the sample signal S is low, and approaching a rising edge at sampling time $t_n$. At rising edges 100 and 102 of input signal I, control circuit 66 operates switches 50 and 54 as described above in connection with FIG. 4, thus providing a measure of the phase offset $a_n$ between the rising edge of the input signal and the next rising edge of the clock signal (clock signal not shown in FIG. 5). The corresponding values produced by A/D 60 are stored in storage location 71 in memory 62. However subsequent to the rising edge of the sample signal at time $t_n$, the next value provided by A/D 60 is stored in storage location 72 as phase offset $b_n$. Once $b_n$ has been stored, control circuit 66 commences a calibration cycle in which the gain $G_n$ and bias $B_n$ of the correction circuit are determined for sampling time $t_n$, and stored in memory locations 73 and 74, respectively.

Gain is herein defined to mean the voltage on capacitor 56, when the capacitor is permitted to charge for one complete cycle of the clock signal. Bias is defined to be a value read by A/D 60 when capacitor 56 is shorted to ground. To measure gain, control circuit 66 opens switch 50 on a rising edge of the clock signal, and opens switch 54 at the next rising edge of the clock signal. With this timing sequence, capacitor 56 charges for one full cycle of the clock signal, and the resulting value is read by A/D 60 and is stored in memory location 73. To measure bias, control circuit 66 opens switches 50 and 54 on the same rising edge of the clock signal, resulting in a "zero" voltage being read by A/D 60, and the resulting value being stored in memory location 74. The resulting bias reading will include any error sources, such as switch resistance, switch charge transfer, amplifier offset, etc.

Gain and bias are utilized by data processor 20 to determine corrected phase values $a'_n$ and $b'_n$ for parameters $a_n$ and $b_n$, respectively. The corrected phase values may be determined as follows:

$$a'_n = \frac{a_n - B_n}{G_n - B_n} \quad (5)$$

$$b'_n = \frac{b_n - B_n}{G_n - B_n} \quad (6)$$

These corrections compensate for all error sources during the measurement, and scale the phase values so that they have the same units as the partial and full counts $X_n$ and $Y_n$, respectively. The described calibration technique can be done in real time between sampling times, and the only accuracy limitation is the repeatability of the circuit over a short interval on the order of the period of the input signal (e.g., 100 microseconds).

The advantages of the present invention can be appreciated by determining the improvement of resolution for a particular example. In this example, it will be assumed that the frequency of the input signal is 34 kHz and that the clock signal frequency is 12 MHz. Referring to FIG. 2, using only integer counter 31, the resolution for each sampling interval would be ± one count. Utilizing partial counter 32 and full counter 33, the error in the determination of count $C_n$ using equation (1) can be determined to be:

$$\frac{EX_{n-1}}{Y_{n-1}} - \frac{EX_n}{Y_n} - \frac{X_{n-1}EY_{n-1}}{(Y_{n-1})^2} + \frac{X_n EY_n}{(Y_n)^2} \quad (7)$$

where EX represents the error in the determination of X, and can vary between 0 and 1 clock count, and EY represents the error in the determination of Y, and can vary from −1 to +1 clock count. Thus, for the particular frequencies stated above, the resolution using counters 31-33 is ±0.0085 counts.

By use of correction circuit 34 of the present invention, the error terms in equation (4) may be determined to be:

$$\frac{Eb_{n-1}}{Y_{n-1} + a_{n-1} - b_{n-1}} - \frac{Eb_n}{Y_n + a_n - b_n} - \quad (8)$$

$$\frac{Ea_{n-1} - Eb_{n-1}}{Y_{n-1} + a_{n-1} - b_{n-1}} + \frac{Ea_n - Eb_n}{Y_n + a_n - b_n}$$

where Ea and Eb are the errors in the determination of a and b, respectively. For an 8 bit A/D, Ea and Eb are ±0.004 clock counts. As a result, the resolution using correction circuit 34 is ±0.000068 counts, a further improvement of over two orders of magnitude.

While the preferred embodiments of the invention have been illustrated and described, variations will be apparent to those skilled in the art. The scope of the invention is therefore to be determined by reference to the following claims.

The embodiments of the invention in which an exclusive property or privilege is claimed are defined as follows:

1. A device for determining the phase of a periodic reference signal at a predetermined time, the device comprising:
   charge storage means;
   current source means;
   first switch means connected between the current source means and a reference potential;
   second switch means connected between the current source means and the charge storage means; and
   control means connected to receive the reference signal and a signal representing the predetermined time, the control means including means for sensing a periodic characteristic of the reference signal, means for causing the current source means to be disconnected from the reference potential at the predetermined time, means for causing the current source means to be disconnected from the charge storage means upon the occurrence of said characteristic after the predetermined time, and means for measuring the voltage on the charge storage means after the occurrence of said characteristic and for producing therefrom a phase signal $a_n$ representing the phase of the reference signal at the predetermined time.

2. The device of claim 1, wherein the control means further comprises calibration means including means for causing the current source means to be disconnected from the reference potential at a gain start time, means for causing the current source means to be disconnected from the charge storage means at a subsequent gain stop time, and means for measuring the voltage on the charge storage means after the gain stop time and for producing therefrom a gain signal G, and wherein the device further comprises processing means for receiving the phase and gain signals and for scaling the phase signal $a_n$ based upon the gain signal to produce a calibrated phase signal $a'_n$.

3. The device of claim 2, wherein the gain stop time follows the gain start time by a time interval substantially equal to the period of the reference signal.

4. The device of claim 3, wherein the calibration means includes means for causing the simultaneous disconnection of the current source means from the reference potential and from the charge storage means, and means for measuring the voltage on the charge storage means after said simultaneous disconnection and for producing therefrom a bias signal B, and wherein the processing means comprises means for receiving the phase, gain and bias signals and for producing the calibrated phase signal $a'_n$ according to the equation:

$$a'_n = \frac{a_n - B}{G - B}$$

5. A method for determining the phase of a periodic reference signal at a predetermined time, the method comprising:
   commencing the charging of a charge storage means at a known rate at the predetermined time;
   stopping the charging of the charge storage means upon the occurrence of a periodic characteristic of the reference signal that occurs after the predetermined time; and measuring the voltage on the charge storage means after the occurrence of said characteristic and for producing therefrom a phase signal $a_n$ representing the phase of the reference signal at the predetermined time.

6. The method of claim 5, comprising the further step of causing the charge storage means to be charged at a known rate for a period of time substantially equal to the period of the reference signal, and for subsequently measuring the voltage on the charge storage means and producing therefrom a gain signal, and scaling the phase signal $a_n$ based upon the gain signal to produce a calibrated phase signal $a'_n$.

7. A device for determining the time of occurrence of a sampling time $t_n$ in a time period that extends from a first measurement time $t_a$ to a second measurement time $t_b$, the device comprising:

means for providing a periodic clock signal having a period shorter than the time period between the measurement times;

first counter means for determining a first count value by counting the number of cycles of the clock signal that occur between times $t_n$ and $t_b$, and for producing a corresponding first count signal $X_n$;

second counter means for determining a second count value by counting the number of cycles of the clock signal that occur between the measurement times, and for producing a corresponding second count signal $Y_n$;

a correction circuit for producing phase signals $a_n$ and $b_n$ representing the phase of the clock signal at measurement times $t_a$ and $t_b$ respectively; and processing means for receiving the count and phase signals, for adjusting count signals $X_n$ and $Y_n$ based upon the phase signals to produce corrected count signals $X_{nc}$ and $Y_{nc}$, and for determining the sampling time $t_n$ relative to $t_a$ by determining the quotient $X_{nc}/Y_{nc}$.

8. The device of claim 7, wherein the processing means determines the corrected count values as follows:

$X_{nc} = X_n - b_n$ $Y_{nc} = Y_n + a_n - b_n$.

9. The device of claim 7, wherein the correction circuit includes means for sensing a periodic characteristic of the clock signal, and means operative at each measurement time for measuring the elapsed time between the measurement time and the next occurrence of said period characteristic of the clock signal and for producing therefrom the phase signal corresponding to that measurement time.

10. The device of claim 7, wherein the correction circuit comprises charge storage means, current source means, first switch means connected between the current source means and a reference potential, second switch means connected between the current source means and the charge storage means, and control means connected to receive the clock signal and signals representing the sampling and measurement times, the control means including means for sensing a periodic characteristic of the clock signal, means operative at each measurement time for causing the current source means to be disconnected from the reference potential at the measurement time, means for causing the current source means to be disconnected from the charge storage means upon the occurrence of said characteristic after the measurement time, and means for measuring the voltage on the charge storage means after the occurrence of said characteristic and for producing therefrom the phase signal corresponding to that measurement time.

11. The device of claim 10, wherein the control means further comprises calibration means for producing a gain signal G associated with the sampling time, the calibration means including means for causing the current source means to be disconnected from the reference potential at a gain start time, means for causing the current source means to be disconnected from the charge storage means at a subsequent gain stop time, and means for measuring the voltage on the charge storage means after the gain stop time and for producing therefrom the gain signal G, and wherein the processing means includes means for receiving the phase and gain signals and for scaling the phase signals $a_n$ and $b_n$ based upon the gain signal to produce calibrated phase signals $a'_n$ and $b'_n$ respectively, and means for adjusting the count signals based upon the calibrated phase signals.

12. The device of claim 11, wherein the gain stop time follows the gain start time by a time interval substantially equal to the period of the clock signal.

13. The device of claim 12, wherein the calibration means includes means for causing the simultaneous disconnection of the current source means from the reference potential and from the charge storage means at a bias calibration time associated with the sampling time, and means for measuring the voltage on the charge storage means after said simultaneous disconnection and for producing therefrom a bias signal B, and wherein the processing means includes means for receiving the phase, gain and bias signals and for adjusting phase signals $a_n$ and $b_n$ to produce calibrated signals $a'_n$ and $b'_n$, respectively, according to the equations:

$$a'_n = \frac{a_n - B}{G - B}$$

$$b'_n = \frac{b_n - B}{G - B}$$

14. A method for determining the time of occurrence of a sampling time $t_n$ in a time period that extends from a first measurement time $t_a$ to a second measurement time $t_b$, the method comprising:

providing a periodic clock signal havin a period shorter than the time period between the measurement times;

determining a first count value by counting the number of cycles of the clock signal that occur between times $t_n$ and $t_b$, and for producing a corresponding first count signal $X_n$;

determining a second count value by counting the number of cycles of the clock signal that occur between the measurement times, and for producing a corresponding second count value $Y_n$;

producing phase signals $a_n$ and $b_n$ representing the phase of the clock signal at measurement times $t_a$ and $t_b$ respectively; and adjusting count signals $X_n$ and $Y_n$ based upon the phase signals to produce corrected count signals $X_{nc}$ and $Y_{nc}$, and determining the sampling time $t_n$ relative to $t_a$ by determining the quotient $X_{nc}/Y_{nc}$.

15. The method of claim 14, wherein the processing means determines the corrected count values as follows:

$$X_{nc} = X_n - b_n$$

$$Y_{nc} = Y_n + a_n - b_n.$$

16. The method of claim 14, wherein the step of producing the phase signals comprises, at each measurement time, the step of measuring the elapsed time between the measurement time and the next occurrence of a periodic characteristic of the clock signal, and producing therefrom the phase signal corresponding to that measurement time.

17. The method of claim 14, wherein the step of producing the phase signals comprises, at each measurement time, the further steps of commencing the charging of a charge storage means at a known rate at the measurement time, stopping the charging of the charge storage means upon the occurrence of a periodic characteristic of the clock signal that occurs after the measurement time, and measuring the voltage on the charge storage means after the occurrence of said characteristic of the clock signal and producing therefrom the phase signal corresponding to that measurement time.

18. The method of claim 17, comprising the further step of causing the charge storage means to be charged at a known rate for a period of time substantially equal to the period of the reference signal, and for subsequently measuring the voltage on the charge storage means and producing therefrom a gain signal G associated with the sampling time, and scaling the phase signals $a_n$ and $b_n$ based upon the gain signal to produce calibrated phase signals $a'_a$ and $b'_n$ respectively, and adjusting the count signals based upon the calibrated phase signals.

19. A device for measuring the frequency of an input signal by measuring the number of cycles of the input signal that occur in a sample interval between first and second sampling times, the device comprising:
means for providing a periodic clock signal having a frequency higher than that of the input signal;
integer counter means including means for sensing a periodic characteristic of the input signal, and for producing therefrom an integer signal representing an estimated integer number N of cycles of the input signal that occur in the sampling interval;
fraction measurement means for determining the time of occurrence of each sampling time $t_n$ in a time period that extends from a first measurement time $t_a$ corresponding to the occurrence of the characteristic of the input signal preceding $t_n$ to a second measurement time $t_b$ corresponding to the occurrence of the characteristic of the input signal following $t_n$, the fraction measurement means comprising:
(i) first counter means for determining a first count value by counting the number of cycles of the clock signal that occur between times $t_n$ and $t_b$, and for producing a corresponding first count signal $X_n$;
(ii) second counter means for determining a second count value by counting the number of cycles of the clock signal that occur between the measurement times and for producing a corresponding second count signal $Y_n$; and
(iii) a correction circuit for producing phase signals $a_n$ and $b_n$ representing the phase of the clock signal at measurement times $t_a$ and $t_b$, respectively; and
processing means for receiving the integer signal and the count and phase signals for each sampling time, the processing means including means for adjusting count signals $X_n$ and $Y_n$ for each sampling time based upon the phase signals for that sampling time, to thereby produce corrected count signals $X_{nc}$ and $Y_{nc}$ for each sampling time, and means for measuring the number of cycles $C_n$ of the input signal that occur in the sampling interval by determining N plus the quotient $X_{nc}/Y_{nc}$ for the first sampling time minus the quotient $X_{nc}/Y_{nc}$ for the second sampling time.

20. The device of claim 19, wherein the processing means determines the corrected count values as follows:

$$X_{nc} = X_n - b_n$$

$$Y_{nc} = Y_n + a_n - b_n.$$

21. The device of claim 19, wherein the correction circuit comprises means for sensing a periodic characteristic of the clock signal, and means operative at each measurement time for measuring the elapsed time between the measurement time and the next occurrence of the periodic characteristic of the clock signal, and for producing therefrom the phase signal corresponding to that measurement time.

22. The device of claim 19, wherein the correction circuit comprises charge storage means, current source means, first switch means connected between the current source means and a reference potential, second switch means connected between the current source means and the charge storage means, and control means connected to receive the clock and input signals and a sample signal defining the sampling times, the control means including means for sensing a periodic characteristic of the clock signal, means operative at each measurement time for causing the current source means to be disconnected from the reference potential at the measurement time, for causing the current source means to be disconnected from the charge storage means upon the occurrence of said characteristic of the clock signal after the measurement time, and for measuring the voltage on the charge storage means after the occurrence of said characteristic of the clock signal and for producing therefrom the phase signal corresponding to that measurement time.

23. The device of claim 22, wherein the control means further comprises calibration means for producing a gain signal G for each sampling time, the calibration means including means for causing the current source means to be disconnected from the reference potential at a gain start time, means for causing the current source means to be disconnected from the charge storage means at a subsequent gain stop time, and means for measuring the voltage on the charge storage means after the gain stop time and for producing therefrom the gain signal G for the sampling time, and wherein the processing means includes means for scaling each phase signal based upon the gain signal for the associated sampling time.

24. The device of claim 23, wherein for each sampling time, the gain stop time follows the gain start time by a time interval substantially equal to the period of the clock signal.

25. The device of claim 24, wherein the calibration means includes means for causing the simultaneous disconnection of the current source means from the reference potential and from the charge storage means at bias calibration times associated with the respective sampling times, and means for measuring the voltage on the charge storage means after said simultaneous disconnection for each bias calibration time and for producing therefrom a bias signal B for the sampling time, and wherein the processing means includes means for receiving the phase, gain and bias signals and for adjusting phase signals $a_n$ and $b_n$ for each sampling time to produce calibrated phase signals $a_n'$ and $b_n'$ respectively for the sampling time, according to the equations:

$$a'_n = \frac{a_n - B}{G - B}$$

$$b'_n = \frac{b_n - B}{G - B}$$

where G and B are the gain and bias signals, respectively, for the associated sampling time.

26. A method for measuring the frequency of an input signal by measuring the number of cycles of the input signal that occur in a sample interval between first and second sampling times, the method comprising:

providing a periodic clock signal having a frequency higher than that of the input signal;

sensing a predetermined periodic characteristic of the input signal and producing therefrom an integer signal representing an estimated number N of cycles of the input signal that occur in the sampling interval;

determining the time of occurrence of each sampling time $t_n$ in a time period that extends from a first measurement time $t_a$ corresponding to the occurrence of the characteristic of the input signal preceding $t_n$ to a second measurement time $t_b$ corresponding to the characteristic of the input signal occurring following $t_n$, the step of determining the time of occurrence of each sampling time $t_n$ comprising:

(i) determining a first count value by counting the number of cycles of the clock signal that occur between times $t_n$ and $t_b$ and producing a corresponding first count signal $X_n$;

(ii) determining a second count value by counting the number of cycles of the clock signal that occur between the measurement times and producing a corresponding second count signal $Y_n$; and (iii) producing phase signals $a_n$ and $b_n$ representing the phase of the clock signal at measurement times $t_a$ and $t_b$, respectively; and, adjusting count signals $X_n$ and $Y_n$ for each sampling time based upon the phase signals for that sampling time, to thereby produce corrected count signals $X_{nc}$ and $Y_{nc}$ for each sampling time, and measuring the number of cycles $C_n$ of the input signal that occur in the sampling interval by determining N plus the quotient $X_{nc}/Y_{nc}$ for the first sampling time minus the quotient $X_{nc}/Y_{nc}$ for the second sampling time.

27. The method of claim 26, wherein the processing means determines the corrected count values as folows:

$$X_{nc} = X_n - b_n$$

$$Y_{nc} = Y_n + a_n - b_n.$$

28. The method of claim 26, wherein the step of producing the phase signals comprises, at each measurement time, the further steps of measuring the elapsed time between the measurement time and the next occurrence of a periodic characteristic of the clock signal, and producing therefrom the phase signal corresponding to that measurement time.

29. The method of claim 26, wherein the step of producing the phase signals comprises, at each measurement time, the further steps of commencing the charging of a charge storage means at a known rate at the measurement time, stopping the charging of the charge storage means upon the occurrence of a periodic characteristic of the clock signal that occurs after the measurement time, and measuring the voltage on the charge storage means after the occurrence of said characteristic of the clock signal and producing therefrom the phase signal corresponding to that measurement time.

30. The method of claim 29, comprising the further step, at each sampling time, of causing the charge storage means to be charged at a known rate for a period of time substantially equal to the period of the clock signal, and for subsequently measuring the voltage on the charge storage means and producing therefrom a gain signal G for the associated sampling time, and scaling the phase signals $a_n$ and $b_n$ based upon the gain signal to produce calibrated phase signals $a'_n$ and $b'_n$ respectively for each sampling time, and adjusting the count signals for each sampling time based upon the associated calibrated phase signal.

* * * * *